(12) United States Patent
Kim

(10) Patent No.: US 8,421,089 B2
(45) Date of Patent: Apr. 16, 2013

(54) LIGHT EMITTING DEVICE

(75) Inventor: Wan Ho Kim, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 562 days.

(21) Appl. No.: 12/674,397

(22) PCT Filed: Aug. 11, 2008

(86) PCT No.: PCT/KR2008/004670
§ 371 (c)(1),
(2), (4) Date: Feb. 19, 2010

(87) PCT Pub. No.: WO2009/025462
PCT Pub. Date: Feb. 26, 2009

(65) Prior Publication Data
US 2011/0215359 A1 Sep. 8, 2011

(30) Foreign Application Priority Data

Aug. 20, 2007 (KR) .................. 10-2007-0083158

(51) Int. Cl.
*H01L 27/15* (2006.01)
*H01L 31/12* (2006.01)
*H01L 33/00* (2010.01)

(52) U.S. Cl.
USPC ............ 257/79; 257/200; 257/201; 257/666; 257/E21.006; 257/E21.352; 257/E21.499; 257/E21.502; 257/E21.503; 257/E21.509

(58) Field of Classification Search ............... 257/79, 257/88, 99, 199, 200, 201, 666, E21.006, 257/E21.352, E21.499, E21.502, E21.503, 257/E21.509
See application file for complete search history.

(56) References Cited

U.S. PATENT DOCUMENTS

| 6,310,364 | B1 * | 10/2001 | Uemura .................. 257/100 |
| 6,642,547 | B2 * | 11/2003 | Matsubara et al. ............ 257/98 |
| 6,680,568 | B2 * | 1/2004 | Fujiwara et al. ............. 313/501 |
| 6,914,267 | B2 | 7/2005 | Fukasawa et al. |
| 6,995,510 | B2 * | 2/2006 | Murakami et al. ............ 313/512 |

FOREIGN PATENT DOCUMENTS

| JP | 2006-222454 A | 8/2006 |
| KR | 20-0335192 | 11/2003 |

* cited by examiner

*Primary Examiner* — David Nhu
(74) *Attorney, Agent, or Firm* — Birch, Stewart, Kolasch & Birch, LLP

(57) ABSTRACT

A light emitting device includes a substrate, a first lead frame and a second lead frame on the substrate, an installation portion electrically connected to the first lead frame or the second lead frame, the installation portion being thinner than the first lead frame or the second lead frames, a light emitting diode on the installation portion, and a conductive member electrically connecting at least one of the lead frames to the light emitting diode.

28 Claims, 1 Drawing Sheet

LIGHT EMITTING DEVICE

This application is a 371 of PCT/KR2008/004670 filed Aug. 11, 2008; Republic of Korea 10-2007-0083158 filed Aug. 20, 2007.

TECHNICAL FIELD

The present disclosure relates to a light emitting device.

BACKGROUND ART

A light emitting diode (LED) includes a light emitting source formed of a compound semiconductor material such as GaAs, AlGaAs, GaN, InGaN, and AlGaInP to realize a variety of colors.

Light emitting devices using the LEDs are used as light sources of a variety of electronic devices or lightings.

DISCLOSURE OF INVENTION

Technical Problem

Embodiments provide a light emitting device.

Embodiments also provide a light emitting device that is relatively thin.

Embodiments also provide a light emitting device that can be securely provided on a substrate.

Technical Solution

In an embodiment, a light emitting device comprises a substrate, a first lead frame and a second lead frame on the substrate, an installation portion electrically connected to the first lead frame or the second lead frame, the installation portion being thinner than the first lead frame or the second lead frames, a light emitting diode on the installation portion, and a conductive member electrically connecting at least one of the lead frames to the light emitting diode In an embodiment, a light emitting device comprises a substrate; a first lead frame and a second lead frame on the substrate comprising a partly etched portion in at least one of the first lead frame and the second lead frame; a light emitting diode on the partly etched portion; and a conductive member electrically connecting at least one of the lead frames to the light emitting diode.

ADVANTAGEOUS EFFECTS

The embodiments can provide a light emitting device.

The embodiments also can provide a light emitting device that is relatively thin.

The embodiment also can provide a light emitting device that can be securely provided on a substrate.

The details of one or more embodiments are set forth in the accompanying drawings and the description below. Other features will be apparent from the description and drawings, and from the claims.

MODE FOR THE INVENTION

Reference will now be made in detail to the embodiments of the present disclosure, examples of which are illustrated in the accompanying drawings.

In the following description, it will be understood that when a layer (or film) is referred to as being "on" another layer or substrate, it can be directly on the other layer or substrate, or intervening layers may also be present. Further, it will be understood that when a layer is referred to as being "under" another layer, it can be directly under the other layer, and one or more intervening layers may also be present. In addition, it will also be understood that when a layer is referred to as being "between" two layers, it can be the only layer between the two layers, or one or more intervening layers may also be present.

In the figures, the dimensions of layers and regions are exaggerated for clarity of illustration. In addition, the dimension of each part does not reflect an actual size.

Figure 1:
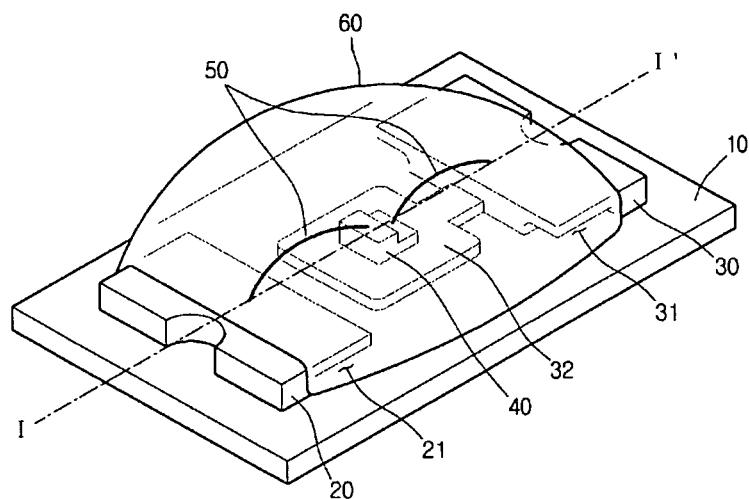
FIG. 1 is a perspective view of a light emitting device according to an embodiment.
Figure 2:
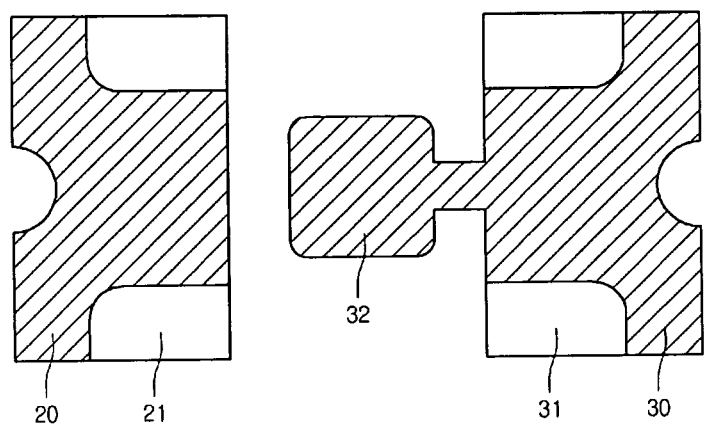
FIG. 2 is a view illustrating first and second lead frames of the light emitting device of FIG. 1.
Figure 3:
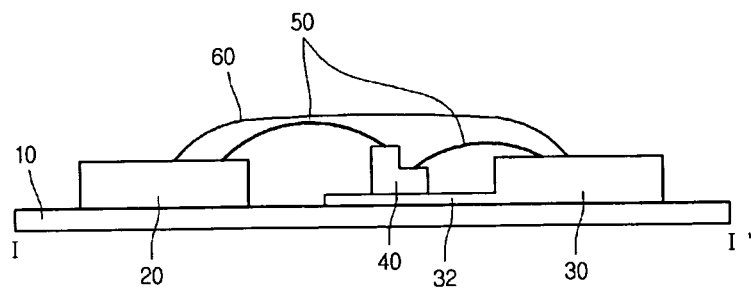
FIG. 3 is a side view of the light emitting device of FIG. 1.

FIG. 1 is a perspective view of a light emitting device according to an embodiment, FIG. 2 is a view illustrating undersurfaces of first and second lead frames of the light emitting device of FIG. 1, and FIG. 3 is a side view of the light emitting device of FIG. 1.

Referring to FIGS. 1 to 3, a light emitting device includes a substrate 10, first and second lead frames 20 and 30 on the substrate 10, and a light emitting diode 40 on the second lead frame 30.

A first electrode layer provided on the light emitting diode 40 is electrically connected to the first lead frame 20 by a conductive wire 50. A second electrode layer provided on the light emitting diode 40 is electrically connected to the second lead frame 30 by another wire 50.

In the embodiment, the first and second lead frames 20 and 30 are electrically connected to the light emitting diode 40 by the wires 50. However, when the second electrode layer is formed under the light emitting diode 40, the light emitting diode 40 is electrically connected to the second lead frame 30 without a wire.

In this case, the light emitting diode 40 can be driven using only one wire.

Further, a molding member 60 including phosphors may be further provided to protect the light emitting diode 40 and the wires 50. The molding member 60 may alter distribution of the light emitted from the light emitting diode 40 in accordance with a shape thereof.

The substrate 10 may be formed of ceramic or silicon. A printed circuit board or a wafer may be used as the substrate 10.

The first and second lead frames 20 and 30 are provided to electric power to the light emitting diode 40. The first and second lead frames 20 and 30 may be formed of a variety of metals.

For example, the first and second lead frames 20 and 30 may be formed of Cu and coated with Ag or Al.

The second lead frame 30 includes an installation portion 32 at which the light emitting diode 40 is installed.

The installation portion 32 integrally extends from the second lead frame 30. The installation portion 32 is thinner than the second lead frame 30.

For example, the first and second lead frames 20 and 30 are formed to have a thickness of 0.08-0.12 mm and the installation portion is formed to have a thickness of 0.02-0.04 mm. In addition, the light emitting diode 40 is formed to have a height of 0.08-0.1 mm. A height from the top surface of the substrate 10 to a top of the molding member 60 is about 0.18-0.22 mm.

In the embodiment, the first and second lead frames 20 and 30 are designed to have a thickness of 0.1 mm, the installation portion 32 is designed to have a thickness of 0.03 mm, the light emitting diode 40 is designed to have a height of 0.09 mm, and a height from the top surface of the substrate 10 to the top of the molding member 60 is 0.2 mm.

According to the embodiment, since the installation portion 32 at which the light emitting diode 40 is installed is designed to be thinner than the second lead frame 30, a size of the light emitting device can be reduced.

Here, the installation portion 32 may be formed by partly etching the second lead frame 30.

Meanwhile, the first lead frame 20 is provided with a first space portion 21 formed by partly removing a side surface thereof. The second lead frame 30 is provided with a second space potion 31 formed by partly removing a side surface thereof.

Here, the first and second space portions 21 and 31 may be formed by partly etching the side surfaces of the first and second lead frames 20 and 30.

The molding member 60 is filled in the first and second space portions 21 and 31. That is, a portion of the molding member 60 is formed between the first and second lead frames 20 and 30 and the substrate 10.

As the molding member 60 filled in the first and second space portions 21 and 31 is hardened, the first and second lead frames 20 and 30 are securely coupled to the substrate 10.

According to the embodiment, the light emitting device can be designed to be relatively thin and the molding member 60 can be more securely coupled to the substrate 10.

Any reference in this specification to "one embodiment," "an embodiment," "exemplary embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with others of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

Industrial Applicability

The light emitting device of the embodiments can be used as lightings or light sources of a variety of electronic devices.

The invention claimed is:

1. A light emitting device comprising:
a substrate;
a first lead frame and a second lead frame on the substrate;
an installation portion electrically connected to the first lead frame or the second lead frame, the installation portion being thinner than the first lead frame or the second lead frame;
a light emitting diode on the installation portion; and
a conductive member electrically connecting at least one of the lead frames to the light emitting diode,
wherein the installation portion is integrally formed with the first lead frame or the second lead frame.

2. The light emitting device according to claim 1, comprising a molding member covering the light emitting diode and the conductive member.

3. The light emitting device according to claim 1, wherein the conductive member electrically connects the first lead frame to a first electrode of the light emitting diode and electrically connects the second lead frame to a second electrode of the light emitting diode.

4. The light emitting device according to claim 1, wherein the conductive member electrically connects the first lead frame to a first electrode of the light emitting diode and the installation portion electrically connects the second lead frame to a second electrode of the light emitting diode.

5. The light emitting device according to claim 1, wherein at least one of side surfaces of the first and second lead frames is partly removed to define a space portion.

6. The light emitting device according to claim 2, wherein the molding member is formed between the substrate and at least one of the first and second lead frames.

7. The light emitting device according to claim 1, wherein each of the first and second lead frames is designed to have a thickness of 0.08-0.12 mm and the installation portion is designed to have a thickness of 0.02-0.04 mm.

8. The light emitting device according to claim 2, wherein the molding member includes phosphors.

9. A light emitting device comprising:
a substrate;
a first lead frame and a second lead frame on the substrate comprising a partly etched portion in at least one of the first lead frame and the second lead frame;
a light emitting diode on the partly etched portion; and
a conductive member electrically connecting at least one of the lead frames to the light emitting diode,
wherein the partly etched portion is integrally formed with the first lead frame or the second lead frame.

10. The light emitting device according to claim 9, comprising a molding member covering the light emitting diode and the conductive member.

11. The light emitting device according to claim 9, wherein the conductive member is a wire.

12. The light emitting device according to claim 9, wherein a side surface of at least one of the first and second lead frames is partly removed to define a space portion.

13. The light emitting device according to claim 10, wherein the molding member is formed between at least one of the first and second lead frames and the substrate.

14. The light emitting device according to claim 9, wherein the conductive member electrically connects the first lead frame to a first electrode of the light emitting diode and electrically connects the second lead frame to a second electrode of the light emitting diode.

15. The light emitting device according to claim 9, wherein the partly etched portion is formed by etching a part of top surface of the second lead frame.

16. The light emitting device according to claim 9, wherein the conductive member electrically connects the first lead frame to a first electrode of the light emitting diode and the partly etched portion electrically connects the second lead frame to a second electrode of the light emitting diode.

17. The light emitting device according to claim 9, wherein each of the first and second lead frames is designed to have a thickness of 0.08-0.12 mm and the partly etched portion is designed to have a thickness of 0.02-0.04 mm.

18. The light emitting device according to claim 10, wherein the molding member includes phosphors.

19. A light emitting device comprising:
a substrate;
a first lead frame and a second lead frame on the substrate;
an installation portion electrically connected to the first lead frame or the second lead frame;
a light emitting diode on the installation portion; and
a conductive member electrically connecting at least one of the lead frames to the light emitting diode,
wherein the sum of the thicknesses of the substrate and the installation portion is smaller than the sum of the thicknesses of the substrate and the first lead frame or the second lead frame, and
wherein the installation portion is integrally formed with the first lead frame or the second lead frame.

20. The light emitting device according to claim 19, wherein the substrate is formed of ceramic or silicon.

21. The light emitting device according to claim 19, wherein the first lead frame or the second lead frame has space portions and the space portions securely couple the substrate to the first lead frame or the second lead frame.

22. The light emitting device according to claim 21, wherein the bottom surface of the first lead frame or the second lead frame on the space portion is higher than the top surface of the installation portion.

23. The light emitting device according to claim 21, wherein the space portions of the first lead frame or the second lead frame face the installation portion.

24. The light emitting device according to claim 21, wherein the space portion is disposed between the substrate and the first lead frame or the second lead frame.

25. The light emitting device according to claim 19, comprising a molding member covering the light emitting diode and the conductive member.

26. The light emitting device according to claim 19, wherein the conductive member electrically connects the first lead frame to a first electrode of the light emitting diode and the installation portion electrically connects the second lead frame to a second electrode of the light emitting diode.

27. The light emitting device according to claim 19, wherein each of the first and second lead frames is designed to have a thickness of 0.08-0.12 mm and the installation portion is designed to have a thickness of 0.02-0.04 mm.

28. The light emitting device according to claim 25, wherein the molding member includes phosphors.

* * * * *